(12) United States Patent
Lee

(10) Patent No.: US 6,518,595 B2
(45) Date of Patent: Feb. 11, 2003

(54) SEMICONDUCTOR MEMORY DEVICE FOR REDUCING POWER CONSUMPTION DURING REFRESH

(75) Inventor: Hyung-Dong Lee, Kyoungki-do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/879,317

(22) Filed: Jun. 12, 2001

(65) Prior Publication Data

US 2002/0001894 A1 Jan. 3, 2002

(30) Foreign Application Priority Data

Jun. 30, 2000 (KR) .............................. 00-37418

(51) Int. Cl.[7] ......................................... H01L 31/0376
(52) U.S. Cl. ........................ 257/66; 257/71; 257/296; 257/390
(58) Field of Search ....................... 257/66, 71, 296, 257/315, 390; 365/206, 222, 233, 233.5; 713/400, 600

(56) References Cited

U.S. PATENT DOCUMENTS

| | | | |
|---|---|---|---|
| 5,703,823 A | * | 12/1997 | Douse et al. ............... 365/222 |
| 6,212,126 B1 | * | 4/2001 | Sakamoto .................... 365/194 |
| 6,226,755 B1 | * | 5/2001 | Reeves ........................ 713/400 |
| 6,229,749 B1 | * | 5/2001 | Cowles et al. .............. 365/222 |
| 6,343,042 B1 | * | 1/2002 | Tsern et al. ................. 365/222 |

* cited by examiner

Primary Examiner—David Nelms
Assistant Examiner—Dao H. Nguyen
(74) Attorney, Agent, or Firm—Marshall, Gerstein & Borun

(57) ABSTRACT

A semiconductor memory device that reduces the level of power consumption during a refresh operation includes a controller for generating a refresh signal in response to an auto-refresh signal and a self-refresh signal. The semiconductor memory device further includes a bank counter for generating a bank selection signal and a bank count signal, which are used in selecting a bank in response to the refresh signal, and a bank selector for generating a first and a second bank enable signal that are used to selectively enable each bank in response to the bank selection signal and the bank count signal. Additionally, the semiconductor memory device includes a refresh counter controller for generating a counter active signal in response to the bank selection signal and the refresh signal and a refresh counter for generating a row address signal that is used to access the memory cell in response to the counter active signal.

5 Claims, 6 Drawing Sheets

SEMICONDUCTOR MEMORY DEVICE FOR REDUCING POWER CONSUMPTION DURING REFRESH

FIELD OF THE INVENTION

The present invention relates to a semiconductor memory device and, more particularly, to a semiconductor memory device that reduces power consumption during a refresh operation.

DESCRIPTION OF RELATED TECHNOLOGY

In a DRAM device, a refresh operation is conducted to preserve data that is stored within the memory cells of the DRAM device. The refresh operation involves a sequence of procedures by which data stored in the memory cells is read out, amplified, and restored in the memory cells. As is known, DRAM memory cells include capacitors and, thus, the absence of a refresh operation allows the leakage current of these capacitors to cause a loss of data stored in the DRAM memory cells.

FIG. 1A is a schematic diagram of a conventional refresh block. As shown in FIG. 1A, the conventional refresh block includes a controller 110 for generating a counter active signal CNT_AC and a row active signal R_AC in response to an auto-refresh signal A_REF that is activated during an auto-refresh operation and a self-refresh signal S_REF that is activated during a self-refresh operation. The conventional refresh block also includes a refresh counter 130, which responds to the counter active signal CNT_AC and which generates a row address signal R_AD and a bank address signal B_AD[0:3] that are used to select an address of the memory cell to be refreshed. Additionally, the refresh block includes a bank selector 150, which responds to the row active signal R_AC and the bank address signal B_AD[0:3] to generate a bank enable signal B_EN[0:3] that is used to control access to a bank of memory cells, including the memory cell to be refreshed.

FIG. 1B is a detailed block diagram of the refresh counter 130 shown in FIG. 1A. As shown in FIG. 1B, to generate the row address signal R_AD and the bank address signal B_AD[0:3] in response to the counter active signal CNT_AC from the controller 110, the refresh counter 130 includes a plurality of unit counters 131–133 that generate an internal address signal I_AD[1:N]. The number of unit counters typically corresponds to the number of address bits outputted by each unit counter.

The operation of the conventional refresh block will now be described with reference to FIGS. 2A and 2B. FIG. 2A is a timing diagram of a prior art refresh operation and FIG. 2B is a timing diagram in a 64M SDRAM having 4 k cycles.

In the DRAM, the refresh operation includes an auto-refresh operation and a self-refresh operation. If such a refresh operation is activated, an overall memory cell is accessed to read out data stored in the memory cell that is to be restored in the memory cell. To access the memory cell, the refresh counter 130 generates the internal address signal, which is synchronized with the enabling of the auto-refresh operation and the self-refresh operation, to design a memory cell between banks, performing the refresh operation. Specifically, if the auto-refresh signal A_REF or the self-refresh signal S_REF is activated, the controller 110 enables the counter active signal CNT_AC and the row active signal R_AC.

In response to the counter active signal CNT_AC, the refresh counter 130 is enabled to activate the plurality of unit counters 131–133, which output the two highest bits of the internal address signal I_AD[1:N] to be used as the bank address signal B_AD[0:3]. The remaining bits are not used as the row address signal R_AD, wherein the row address signal R_AD enables a word line to be refreshed.

As shown in FIG. 2A, if the auto-refresh operation or the self-refresh operation is enabled, the counter active signal CNT_AC is enabled to allow the internal counter to be enabled, thereby permitting all memory cells in all banks to be refreshed. However, the number of memory cells to be refreshed during one cycle is increased with the level of integration in memory devices and the level of power consumption rises in proportion to the increase in the number, which results in a considerable amount of current consumption during the refresh operation.

The 64M-DRAM has a refresh cycle of 4 Kcycles/64 ms, meaning that all 64M memory cells should be refreshed through 4 k refresh operations at 64 ms. In other words, each memory cell should be refreshed every 64 ms, which is commonly referred to as a "cell retention time." To accomplish this, 16 k cells should be refreshed every refresh cycle. This corresponds to 4 k cells per each bank in a four-bank system. Accordingly, the prior art refresh block suffers from a drawback that the power consumption increases with the number of cells to be refreshed in such a manner that in 128M DRAM, 32 k cells per one cycle are refreshed, and in 256M DRAM, 64 k cells per one cycle are refreshed and the like.

SUMMARY OF THE INVENTION

A semiconductor memory device generates an address during a refresh operation that is used to address a memory cell. The memory device includes a controller for generating a refresh signal in response to an auto-refresh signal and a self-refresh signal. The memory device may further include a bank counter that generates a bank selection signal and a bank count signal, which are used in selecting a bank in response to the refresh signal. Still further, the memory device may include a bank selector that generates a first and a second bank enable signal, which are used in selectively enabling each bank in response to the bank selection signal and the bank count signal, a refresh counter controller that generates a counter active signal in response to the bank selection signal and the refresh signal, and a refresh counter that generates a row address signal, which is used in addressing for access to the memory cell in response to the counter active signal.

DETAILED DESCRIPTION OF THE PREFERRED EMBODIMENTS

Figure 1A:
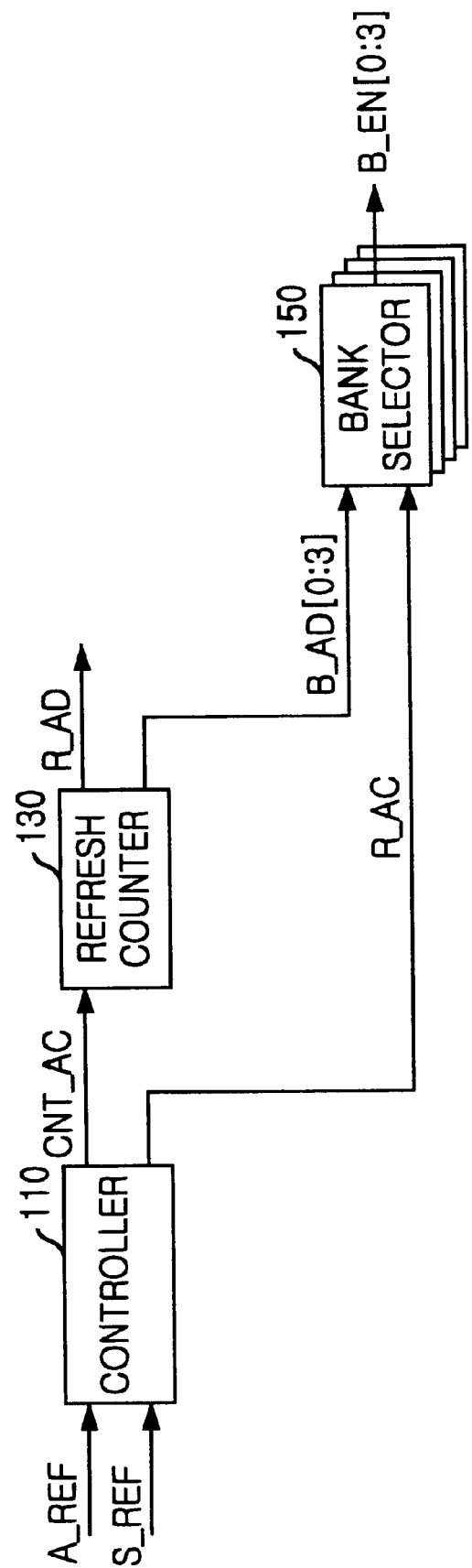
FIG. 1A schematic block diagram of a conventional refresh block.
Figure 1B:
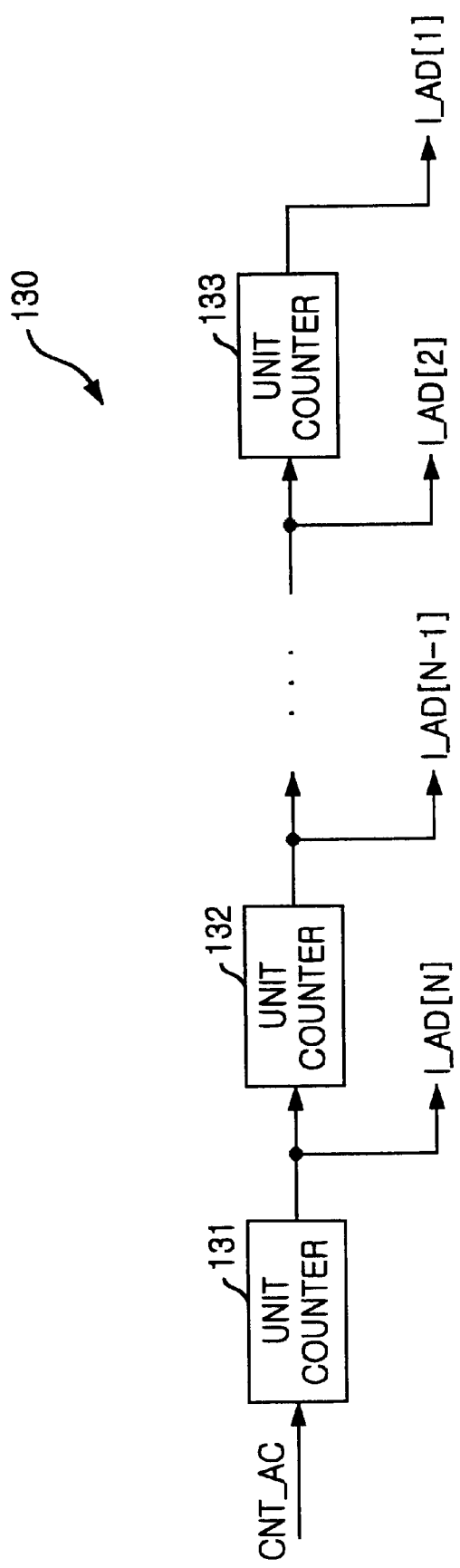
FIG. 1B is a more detailed block diagram of the refresh counter shown in FIG. 1A.
Figure 2A:
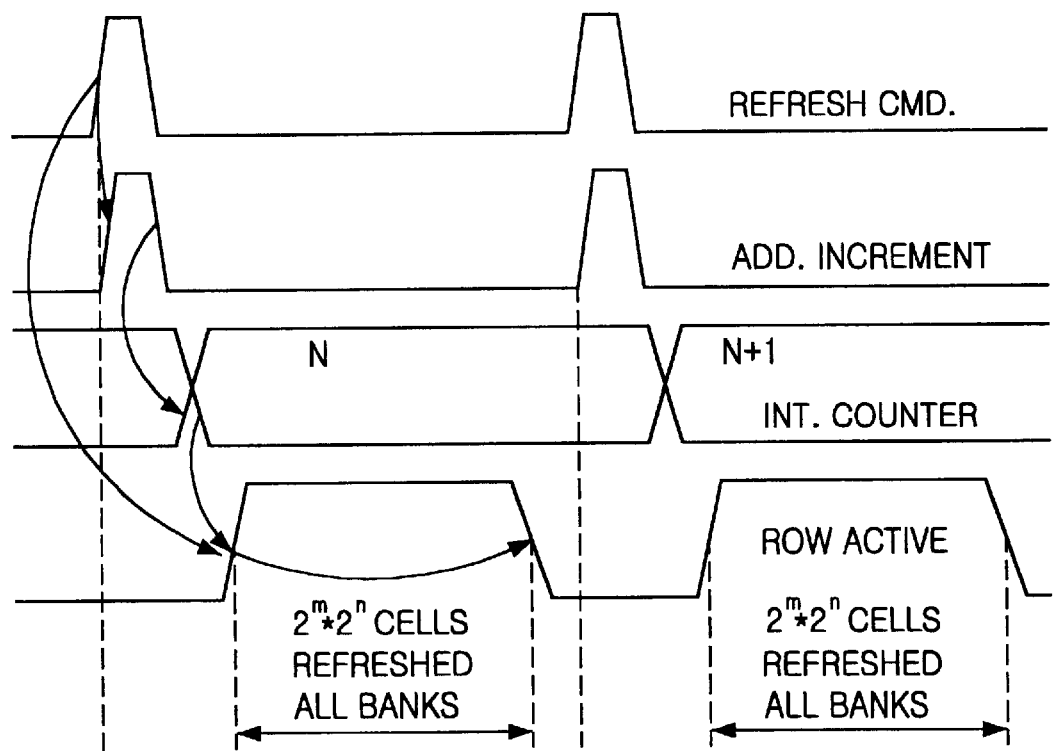
FIG. 2A is a timing diagram of a prior art refresh operation.
Figure 2B:
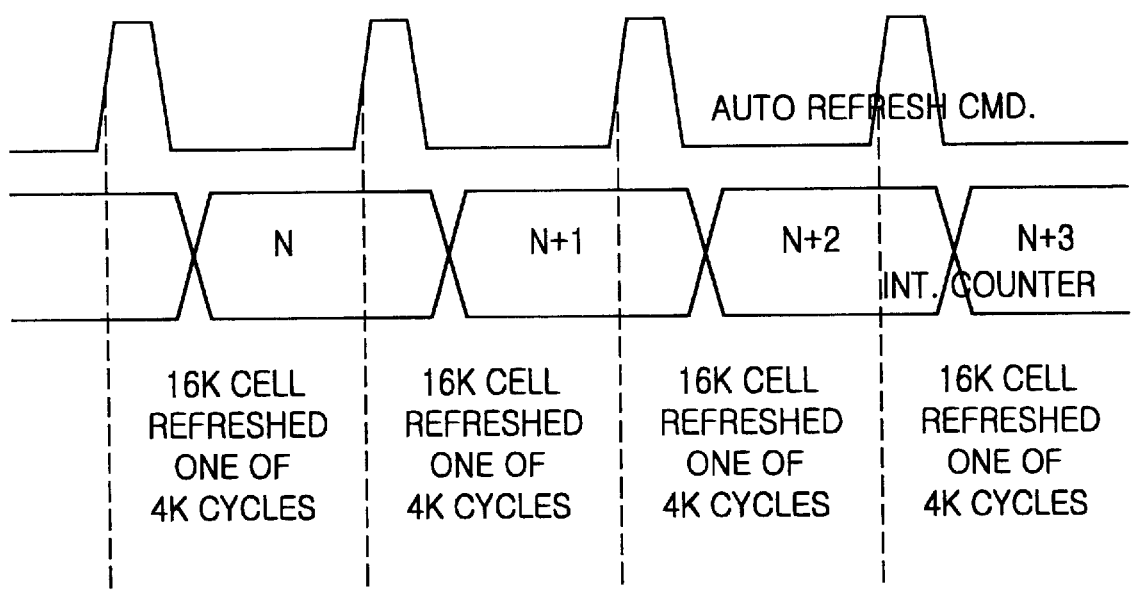
FIG. 2B a timing diagram in a 64M-SDRAM having 4 k cycles.
Figure 3:
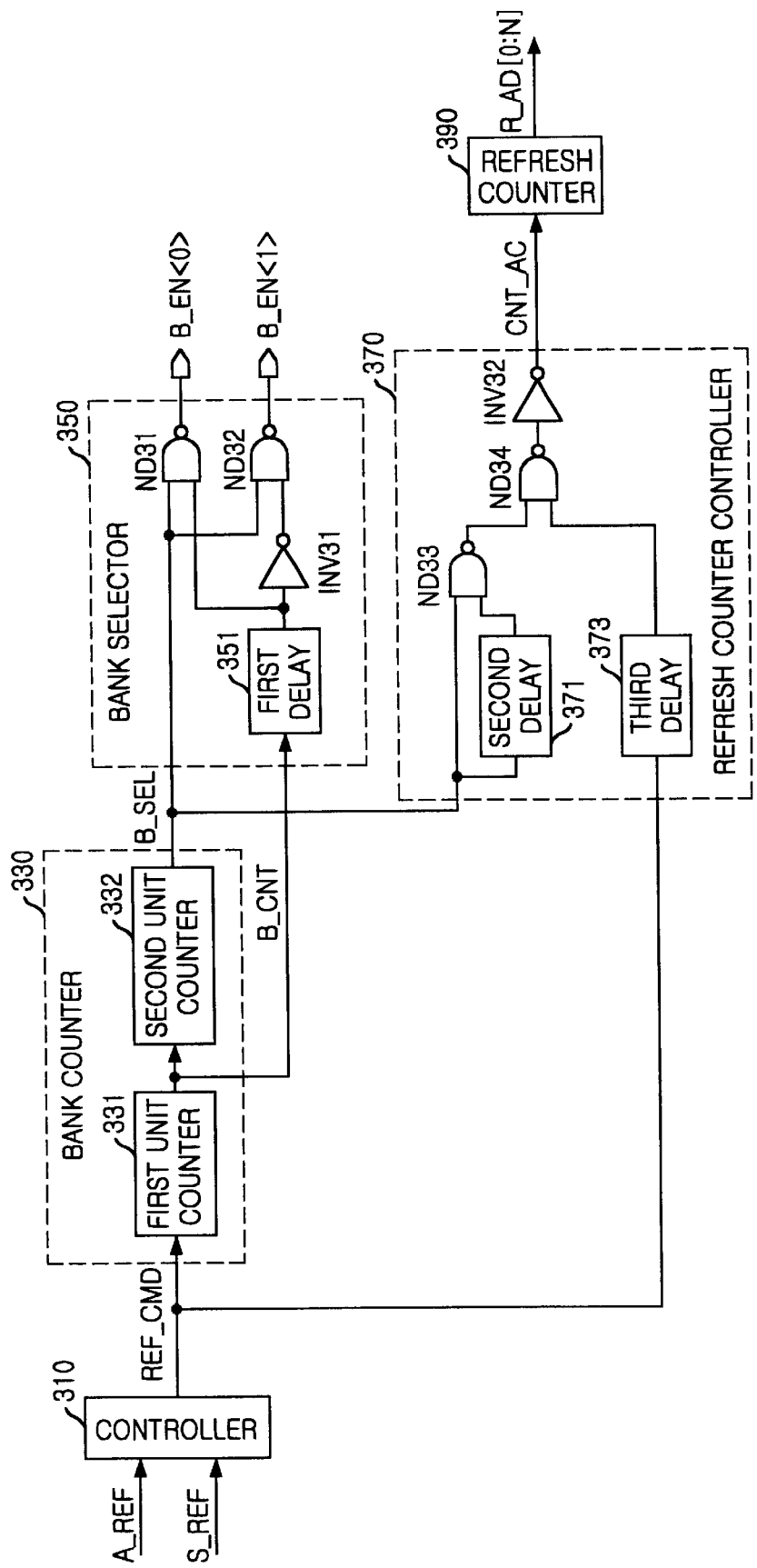
FIG. 3 is an exemplary schematic block diagram of a refresh block in accordance with one embodiment of the present invention.

Referring to FIG. 3, the refresh block includes a controller 310, a bank counter 330, a bank selector 350, a refresh counter controller 370 and a refresh counter 390. The controller 310 generates a refresh signal REF_CMD, which is used to control a refresh operation in response to an auto-refresh signal A_REF and a self-refresh signal S_REF. The bank counter 330 generates a bank selection signal B_SEL and a bank count signal B_CNT, which are used in selecting a bank in response to the refresh signal REF_CMD. The bank selector 350 generates a first and second bank enable signal B_EN<0 > and B_EN<1 >, which are used in selectively enabling each bank in response to the bank selection signal B_SEL and the bank count signal B_CNT. The refresh counter controller 370 generates a counter active signal CNT_AC in response to the bank selection signal B_SEL and the refresh signal REF_CMD. The refresh counter 390 generates a row address signal R_AD[0:N], which is used in addressing for access to the memory cell in response to the counter active signal CNT_AC.

More specifically, the bank counter 330 includes a first unit counter 331 for generating the bank count signal B_CNT based on the refresh signal REF_CMD and a second unit counter 332 for generating the bank selection signal B_SEL based on the bank count signal B_CNT.

The bank selector 350 includes a first delay 351 for delaying the bank count signal B_CNT, a first NAND gate ND31 for performing a NAND operation on the bank selection signal B_SEL and the output of the first delay 351 to a first bank enable signal B_EN<0 >, an inverter INV31 for inverting the output of the first delay 351, and a second NAND gate ND32 for performing a NAND operation on the bank selection signal B_SEL and the output of the inverter INV31 to a second bank enable signal B_EN<1 >.

The refresh counter controller 370 includes a second delay 371 for delaying the bank selection signal B_SEL, a first NAND gate ND33 for performing a NAND operation on the bank selection signal B_SEL and the output of the second delay 371, a third delay 373 for delaying the refresh signal REF_CMD, a second NAND gate ND34 for performing a NAND operation on the outputs of the first NAND gate ND33 and third delay 373, and an inverter INV32 for inverting the output of the second NAND gate ND34 to generate the count active signal CNT_AC.

Figure 4:
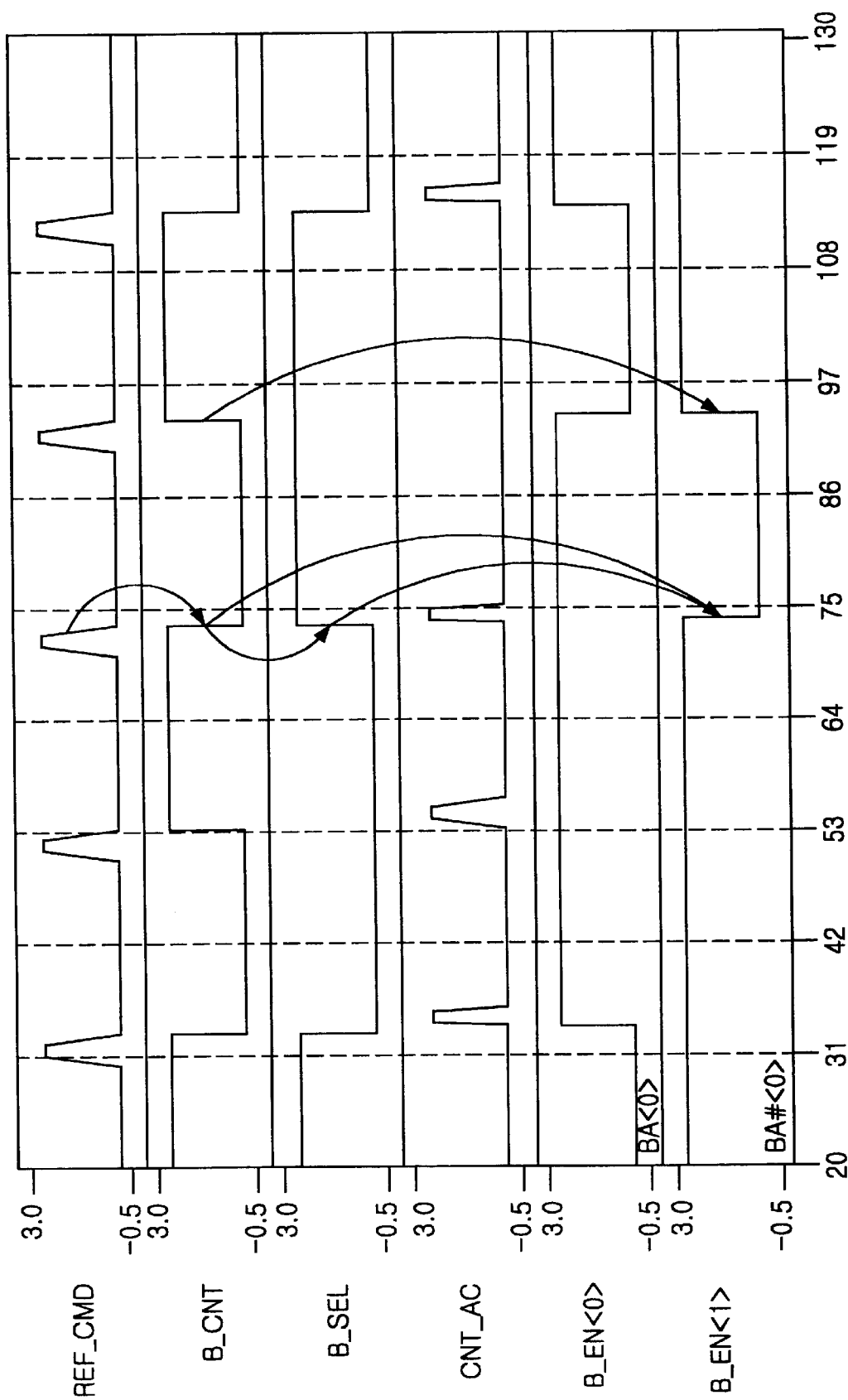
FIG. 4 is an exemplary timing diagram depicting the operation of the refresh block in accordance with one embodiment of the present invention.

FIG. 4 is an exemplary timing diagram depicting the operation of the refresh shown in FIG. 3. In the auto-refresh operation or the self-refresh operation, if the auto-refresh signal A_REF or the self-refresh signal S_REF is enabled, the refresh signal REF_CMD is rendered active to start the refresh operation. The activated refresh signal REF_CMD is directed to the bank counter 330 and the refresh counter controller 370. In the bank counter 330, the first and second unit counters 331 and 332 are enabled to be responsive to the activated refresh signal REF_CMD, outputting the bank count signal B_CNT and the bank selection signal B_SEL, respectively.

In response to the enabled bank selection signal B_SEL and the enabled bank count signal B_CNT, the bank selector 350 generates the first bank enable signal B_EN<0 > and the second bank enable signal B_EN<1 >. As shown in FIG. 4, when the bank selection signal B_SEL is a logic low, both the first and second bank enable signals B_EN<0> and B_EN<1 > are enabled, and when the bank selection signal B_SEL is a logic high, the first and second bank enable signals B_EN<0 > and B_EN<1 > are enabled or disabled according to the bank count signal B_CNT.

The first bank enable signal B_EN<0 > is a first control signal that simultaneously enables or disables two banks in the four bank system, and the second bank enable signal B_EN<1 > is a second control signal that simultaneously enables or disables the remaining two banks therein.

As mentioned above, the rendering of the bank selection signal B_SEL to a logic low allows four banks to be simultaneously enabled. The renderings of the bank selection signal B_SEL to a logic high and the bank count signal B_CNT to a logic low allow the first bank enable signal to be enabled. The renderings of the bank selection signal B_SEL to a logic high and the bank count signal B_CNT to a logic high allow the second bank enable signal to be enabled.

A detailed signal generation will be described below. At the first NAND gate ND31, the first bank enable signal B_EN<0 > is generated by performing a NAND operation on the bank selection signal B_SEL and the delayed bank count signal B_CNT outputted from the first delay 351. At the second NAND gate ND32, the second bank enable signal B_EN<1 > is generated by performing a NAND operation on the bank selection signal B_SEL and the inverted output from the inverter INV31.

The refresh counter controller 370 generates the address for accessing the memory cell in each bank. The refresh signal REF_CMD and the bank selection signal B_SEL are inputted to the refresh counter controller 370. In the refresh counter controller 370, the third delay 373 delays the refresh signal REF_CMD and the second delay 371 delays the bank selection signal B_SEL. If the refresh signal REF_CMD is enabled and the bank selection signal B_SEL is a logic low, the counter active signal CNT_AC is enabled to activate the refresh counter 390. Thus, the refresh counter 390 activates the row address signal R_AD[0:N] which acts as an address signal for sequentially refreshing each memory cell.

The existing refresh process performs the refresh operation every 6 k cycles in the 64M-DRAM (because it is difficult to perform the refresh operation every 8 k cycles) and it employs an additional access technique to reduce power consumption.

Although the preferred embodiments of the invention have been disclosed for illustrative purposes, those skilled in the art will appreciate that various modifications, additions and substitutions are possible, without departing from the scope and the spirit of the invention.

What is claimed is:

1. A semiconductor memory device for generating a memory cell address during a refresh operation, comprising:

a controller for generating a refresh signal in response to an auto-refresh signal and a self-refresh signal;

a bank counter for generating a bank selection signal and a bank count signal that are used in selecting a bank in response to the refresh signal;

a bank selector for generating a first and a second bank enable signal that are used to selectively enabling each bank in response to the bank selection signal and the bank count signal;

a refresh counter controller for generating a counter active signal in response to the bank selection signal and the refresh signal; and a refresh counter for generating a row address signal that is used to access the memory cell in response to the counter active signal, wherein the bank selector includes:

a delay for delaying the bank count signal;

a first NAND gate for performing a NAND operation on the bank selection signal and the output of the delay to form the first bank enable signal;

an inverter for inverting the output of the delay; and
a second NAND gate for performing a NAND operation on the bank selection signal and the output of the inverter to form the second bank enable signal.

2. The semiconductor memory device as recited in claim 1, wherein the bank counter includes:
   a first unit counter for generating the bank count signal based on the refresh signal; and
   a second unit counter for generating the bank selection signal based on the bank count signal.

3. The semiconductor memory device as recited in claim 1, wherein the refresh counter controller includes:
   a second delay for delaying the bank selection signal;
   a third NAND gate for performing a NAND operation on the bank selection signal and the output of the second delay;
   a third delay for delaying the refresh signal;
   a fourth NAND gate for performing a NAND operation on the outputs of the third NAND gate and the third delay; and
   an inverter for inverting the output of the fourth NAND gate to generate the counter active signal.

4. A semiconductor memory device for generating a memory cell address during a refresh operation, comprising:
   a controller for generating a refresh signal in response to an auto-refresh signal and a self-refresh signal;
   a bank counter for generating a bank selection signal and a bank count signal that are used in selecting a bank in response to the refresh signal;
   a bank selector for generating a first and a second bank enable signal that are used to selectively enabling each bank in response to the bank selection signal and the bank count signal;
   a refresh counter controller for generating a counter active signal in response to the bank selection signal and the refresh signal; and
   a refresh counter for generating a row address signal that is used to access the memory cell in response to the counter active signal,
   wherein the refresh counter controller includes:
      a first delay for delaying the bank selection signal;
      a first NAND gate for performing a NAND operation on the bank selection signal and the output of the first delay;
      a second delay for delaying the refresh signal;
      a second NAND gate for performing a NAND operation on the outputs of the first NAND gate and the second delay; and
      an inverter for inverting the output of the second NAND gate to generate the counter active signal.

5. The semiconductor memory device as recited in claim 4, wherein the bank counter includes:
   a first unit counter for generating the bank count signal based on the refresh signal; and
   a second unit counter for generating the bank selection signal based on the bank count signal.

* * * * *